United States Patent
Abbata et al.

(10) Patent No.: US 7,835,887 B2
(45) Date of Patent: Nov. 16, 2010

(54) DETERMINING REAL-TIME PERFORMANCE OF A SUB-ASSEMBLY DRIVEN BY A DC MOTOR

(75) Inventors: Salvatore A. Abbata, Webster, NY (US); Stephen O'Leyar, Fairport, NY (US); Kevin M. Carolan, Webster, NY (US)

(73) Assignee: Xerox Corporation, Norwalk, CT (US)

( * ) Notice: Subject to any disclaimer, the term of this patent is extended or adjusted under 35 U.S.C. 154(b) by 326 days.

(21) Appl. No.: 12/118,771

(22) Filed: May 12, 2008

(65) Prior Publication Data

US 2009/0281734 A1    Nov. 12, 2009

(51) Int. Cl.
G06F 11/00 (2006.01)
G06F 19/00 (2006.01)
H02P 1/04 (2006.01)
H04N 1/36 (2006.01)

(52) U.S. Cl. .................. 702/188; 318/430; 358/413; 700/108

(58) Field of Classification Search .......... 702/188, 702/33–36, 41, 44, 57, 60, 65–67, 71–73, 702/78–79, 81, 84–85, 89, 105–106, 108, 702/113–115, 124–125, 176–177, 182–185, 702/189; 355/97, 407–408; 700/9, 21, 26–27, 700/32, 65, 108–110, 128, 174, 177–178, 700/275; 358/410, 412–413, 443; 318/268, 318/272, 430, 441, 565
See application file for complete search history.

(56) References Cited

U.S. PATENT DOCUMENTS

| | | | |
|---|---|---|---|
| 5,378,975 A * | 1/1995 | Schweid et al. ............ 318/685 |
| 5,502,544 A | 3/1996 | Carolan | |
| 5,543,894 A | 8/1996 | Carolan | |
| 6,338,029 B1 * | 1/2002 | Abbata et al. ............... 702/183 |
| 6,374,075 B1 * | 4/2002 | Benedict et al. ............. 399/395 |
| 6,979,972 B2 | 12/2005 | Carolan | |
| 7,157,873 B2 | 1/2007 | Carolan | |
| 2005/0140327 A1 | 6/2005 | Carolan | |
| 2006/0244404 A1 | 11/2006 | Carolan | |

OTHER PUBLICATIONS

Gurubasavaraj, K.H., Self-Tuning Motion Controller for varying System Parameters, Jun. 15-17, 1988, American Control Conference 1988, pp. 2005-2008.*

(Continued)

*Primary Examiner*—Michael P Nghiem
*Assistant Examiner*—Toan M Le
(74) *Attorney, Agent, or Firm*—Philip E. Blair; Fleit Gibbons Gutman Bongini & Bianco P. L.

(57) ABSTRACT

What is disclosed is a novel system and method for determining real-time performance in a sub-assembly device that is driven by a dc motor. In one example embodiment, an electric motor is energized such that a sub-assembly driven by the motor achieves a target operating speed. Pulse width modulation data is captured and plotted along a time axis. A time duration when the sub-assembly device ended a startup operation and achieved a steady state operation is determined. A portion of the plotted data is then compared to an ideal plot defined for that sub-assembly device. Based on the result of that comparison, a determination is made whether the sub-assembly device is performing within accepted operational parameters. A maintenance operation is signaled to be performed in response to the determined sub-assembly operational performance. The data is stored in a historical database from which a preventative maintenance schedule can be derived.

18 Claims, 8 Drawing Sheets

OTHER PUBLICATIONS

Gurubasavaraj, K.H., Self-Tuning Motion Controller for varying System Parameter, Abstract, Jun. 15-17, 1988, American Control Conference 1988.*

Gurubasavaraj, K.H., Implementation of a Self-Tuning Controller Using Digital Signal Processor Chips, Jun. 1989, IEEE Control Systems Magazine, pp. 38-42.*

* cited by examiner

DETERMINING REAL-TIME PERFORMANCE OF A SUB-ASSEMBLY DRIVEN BY A DC MOTOR

TECHNICAL FIELD

The present invention is directed to systems and methods which use pulse width modulation data to determine real time performance of a sub-assembly device driven by a brushed or brushless direct current (DC) electric motor.

BACKGROUND

Image reproduction devices, such as printers, copiers, scanners, facsimile machines, xerographic devices, etc., involve various image reproduction functions, e.g., paper transporting, print head motion, carriage assembly movement, or other tasks, commonly carried out by servo-mechanisms employing dc motors. Various other sub-assemblies, such as registration, inverter, de-curler, and duplex assemblies within a xerographic device are driven by either belts tensioned around a pulley of a dc motor or direct gear to gear engagement to a dc motor.

During the manufacture of paper transport devices, for example, non-visual defects can be difficult to detect on the production line. Internal problems caused by, for instance, bearing drag, incorrect belt tension, roller misalignment, gear binding, and the like, can be difficult to detect and perhaps missed entirely during a quality control check. Manually running paper through a paper transport device and evaluating the results can be time consuming and costly. Problems and defects may be overlooked entirely.

If a paper transport sub-assembly with internal problems ends up as a device component of a larger complex document reproduction system and subsequently fails, the entire system may be down for repair until a technician can diagnose the problem and replace the failing part. Having a document reproduction system down for repair can result in loss of productivity, loss of revenue, and the like, leading to overall customer dissatisfaction with the product. Thus there is a need in this art for methods which enable the diagnosis and detection of sub-assembly performance problems earlier in the manufacturing process.

Outside of the realm of manufacturing, the determination of performance problems for sub-assemblies becomes more important during the operational life of the document reproduction system when wear and contaminants may cause problems which might degrade overall performance over time. Determining performance problems in sub-assemblies may be very difficult due to their complexity and physical location within the system. Thus there is a need in this art for sophisticated systems and methods for real-time diagnosis of sub-assemblies performance problems by a technician during on-site maintenance.

Accordingly, what is needed in this art are increasingly sophisticated systems and method for detecting and diagnosing real-time performance problems in sub-assemblies driven by a dc motor.

BRIEF SUMMARY

What is provided are a novel system, method, and computer program product for determining real-time performance in a sub-assembly device that is driven by a dc motor, such as a paper transport mechanism in a xerographic system. The present method uses the dc motor itself as a detection device by capturing the pulse width modulation data and using that data to detect abnormal operation, diagnose, and predict problems.

In one embodiment wherein performance of a sub-assembly device is determined for a startup operation, a DC motor controller energizes an electric direct current (dc) motor with electrical power such that the sub-assembly driven by the dc motor achieves a desired operating speed. Startup and steady state pulse width modulation data is captured from the energized motor. The pulse with modulation data can be normalized to compensate for differences in gearing ratios between the energized motor and the sub-assembly device. A startup time performance value is determined from the startup data. A known startup performance value is retrieved from storage and compared to the determined startup time performance value of the sub-assembly. Based on a result of the comparison, a determination is made whether a physical phenomenon exists during a startup operation of the sub-assembly device which requires maintenance. A maintenance operation is signaled to be performed in response to the determined sub-assembly operational performance. The pulse width modulation data and the comparison results are stored. A preventative maintenance schedule for the sub-assembly can be derived from data stored in a historical database.

In another embodiment wherein performance of a sub-assembly device is determined for a steady state operation, a DC Motor controller energizes an electric direct current (dc) motor with electrical power such that the sub-assembly driven by the dc motor achieves a desired operating speed. Startup and steady state pulse width modulation data is captured from the energized motor. The pulse with modulation data can be normalized to compensate for differences in gearing ratios between the energized motor and the sub-assembly device. At least a portion of the steady state data is averaged over a desired timeframe window to obtain at least one steady state performance value. At least one known steady state performance value is retrieved from storage and compared to the determined steady state performance value. Based on a result of the comparison, a determination is made whether a physical phenomenon exists during a steady state operation of the sub-assembly device which requires maintenance. A maintenance operation is signaled to be performed in response to the determined sub-assembly operational performance. Similarly, the data and the results of the comparison are stored.

An apparatus is disclosed for determining real-time performance in a sub-assembly device that is driven by a dc motor. The system has a direct current (dc) motor connected to an electrical energy source and at least one sub-assembly device driven by the rotational movement of the dc motor. The system further has a controller for controlling the dc motor, the controller capable of capturing pulse width modulation data comprising startup and steady state data representative of a torque response of the sub-assembly device. A storage medium is provided and a processor in communication with the storage medium and the controller. The processor capable of executing machine readable instructions. In one embodiment, the instruction involves enabling the system to perform the following. The dc motor is energized with electrical power such that the sub-assembly achieves a desired operating speed. Pulse width modulation data is received from the controller. At least one performance value defined for the sub-assembly device is retrieved from the storage medium and a portion of the captured pulse width modulation data is then compared to the known performance value. Based on a result of the comparison, a determination is made whether the sub-assembly device is performing within an accepted operational parameter. A maintenance operation is signaled to be performed in response to the sub-assembly operational performance. The pulse width modulation data and the comparison results are stored.

The foregoing and other features and advantages will be apparent from the following more particular description of the preferred embodiments of the invention, as illustrated in the accompanying drawings.

BRIEF DESCRIPTION OF THE DRAWINGS

The foregoing and other features and advantages of the subject matter disclosed herein will be made apparent from the following detailed description taken in conjunction with the accompanying drawings, in which.

DETAILED DESCRIPTION

What is provided are a system and method for determining real-time performance in a sub-assembly device that is driven by a dc motor, such as a paper transport mechanism in a xerographic system. The present method uses the dc motor itself as a detection device by capturing the pulse width modulation data and using that data to detect abnormal operation and diagnose problems.

It should be understood that one of ordinary skill in this art would be readily familiar with many facets of direct current (DC) electric motors and DC motor controllers, including obtaining pulse width modulation data, and other related techniques and algorithms common to the art of electronic signature analysis.

Although the description hereof is directed towards a paper transport device driven by a brushless dc motor, it should be understood that the teachings hereof are equally applicable to other sub-assembly devices driven by dc motors where startup and steady state pulse width modulation data can be captured and used for electronic signature analysis in accordance with the teachings hereof.

Figure 1:
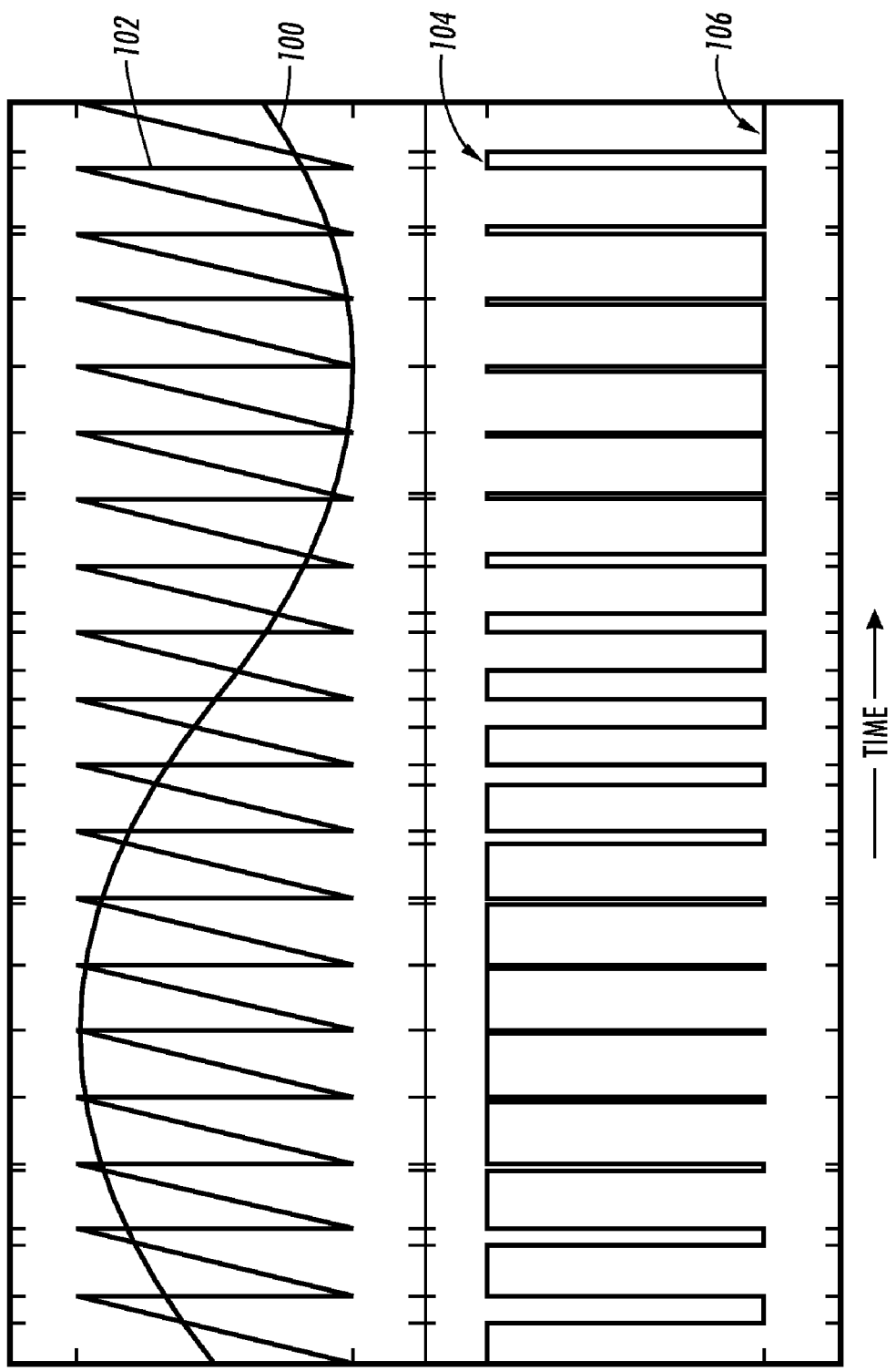
FIG. 1 is illustrative for explaining how a PWM signal is generated via the intersective method.

Reference is now being made to FIG. 1 for explaining one method for generating a PWM signal via the "intersective method". One skilled in this art would appreciate that pulse width modulation (PWM) of a signal or power source involves the modulation of its duty cycle to either convey information over a communications channel or control the amount of power sent to a load. Pulse width modulation uses a square wave whose duty cycle is modulated resulting in the variation of the average value of the waveform.

In general, pulse width modulation is used to reduce the total amount of power delivered to a load without losses normally incurred when a power source is limited by resistive means because the average power delivered is proportional to the modulation duty cycle. PWM is often used in efficient voltage regulators. By switching voltage to the load with the appropriate duty cycle, the output will approximate a voltage at the desired level.

The intersective method requires a comparator circuit and a sawtooth or a triangle waveform generated using, for instance, an oscillator. When the value of the reference signal 100 is more than the modulation waveform 102, the PWM signal 104 is in the high state. Otherwise it is in the low state 106. Other methods include delta pulse width modulation wherein the output signal is compared with limits corresponding to a reference signal offset by a given value. Every time the output signal reaches one of the limits, the PWM signal changes state. In a delta-sigma pulse width modulation, a waveform reference signal on which the output signal (PWM) is subtracted forms an error signal which, when the integral of the error exceeds defined limits, the PWM signal changes state.

Figure 2:
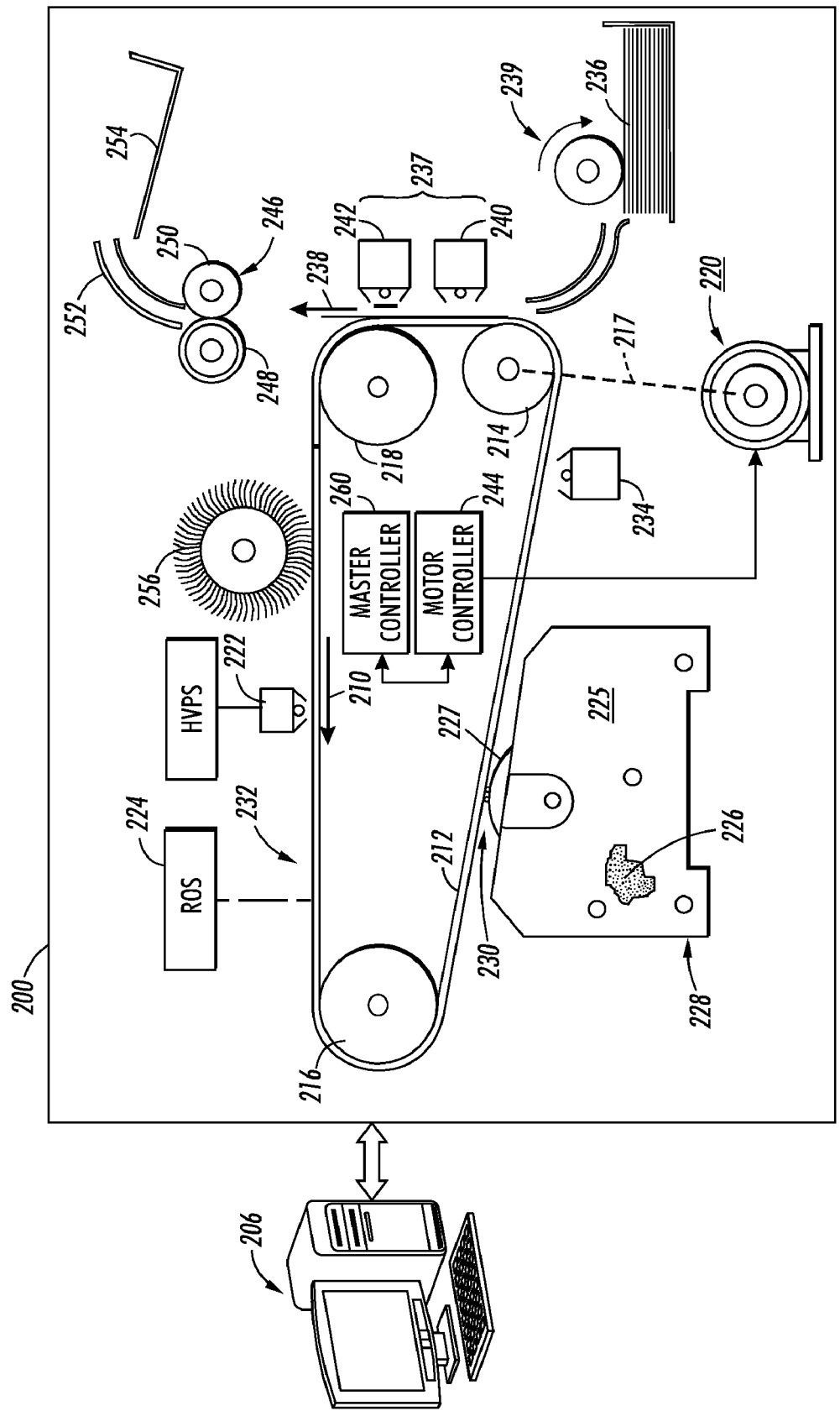
FIG. 2 is a schematic diagram of one embodiment of a document image reproduction device in accordance with various aspects of the present system and method.

Reference is now being made to FIG. 2 which illustrates a schematic diagram of one embodiment of a document image reproduction device in accordance with various aspects of the present system and method.

A document reproduction device 200, for example, is an electro-photographic printing machine which utilizes an image on image process to create a color image on a sheet in a single pass through the machine, or which creates a single black toner image on a sheet. Image forming device 200 is in digital communication with computer system 206 which includes a display, keyboard, and a unit housing a motherboard, CPU, memory, a storage medium, and an interface for communicating to a technician by means well known in the arts, such as email or text messaging, telephonic messages, and the like.

Document reproduction device 200 utilizes a charge retentive member or imaging member in the form of a photoreceptor belt 212, which travels sequentially through various process stations in the direction indicated by arrow 210 wherein each part of the belt passes through various process stations. Belt travel is achieved in the embodiment illustrated by mounting belt 212 about a drive roller 214 and two tension rollers 216 and 218 and then rotating the drive roller 214 via a pulley (shown generally at 217) connected to dc motor 220. A single section of the photoreceptor belt, referred to as the image area, is the part of the photoreceptor belt which receives a toner powder image which, after being transferred to a substrate such as a sheet of paper, produces the final image. It should be appreciated that the photoreceptor belt 212 may have a plurality of image areas depending on the length of the belt and the size of the images. As the photoreceptor belt 212 moves, the image area passes through a corona generating device 222 (charging station) which charges the image area of the photoreceptor belt to a relatively high and substantially uniform potential. The corona generating device is powered by a high voltage power supply (HVPS). After passing through the charging station, the now charged image area passes through an exposure station (indicated generally by 232) wherein the charged image area is exposed to light which illuminates the image area with a light representation of the image. The light representation discharges some parts of the image area so as to create an electrostatic latent image. While the illustration shown utilizes a laser based output scanning device or raster output scanner (ROS) 224 as a light source, other light sources such as an LED printbar, can also be used.

After passing through the exposure station, the now exposed image area passes through a development station 225 which deposits an image of negatively charged toner powder 226 onto the image area. The toner powder is attracted to the less negative sections of the image area and repelled by the more negative sections. The result is a toner powder image on the image area. The development station 225 incorporates a donor roll 227 in a development system 228.

An electrode grid 230 is electrically biased with an AC voltage relative to the donor roll 227 for the purpose of detaching toner therefrom so as to form a toner powder cloud in the gap between the donor roll 227 and the photoreceptor belt 212. Both the electrode grid and the donor roll are biased at a dc potential for discharge area development (DAD). The discharged photoreceptor image attracts toner particles from the toner powder cloud to form a toner powder image. The toner powder image is advanced past a corotron member 234 to a transfer station 237 wherein the toner powder image is transferred from the image area of the photoreceptor belt onto a paper sheet 236 (or a transparency, or any other media adapted to receive marking particles) which is advanced by a conventional sheet feeding apparatus 239 in the direction of arrow 238. The transfer station 237 generally includes a transfer assist blade system (not shown) which applies a uniform contact pressure to the sheet as paper sheet 236 is advanced by sheet feeding apparatus 239.

The transfer station 237 further includes a transfer corona device 240 which sprays positive ions onto the paper sheet and an acoustic transfer assist system (not shown) which impart vibrations to the photoreceptor belt 212 during operation of the corona device. Operation of the transfer corona device and the acoustic transfer assist system causes the negatively charged toner powder image to move onto the paper sheet. Positioned downstream relative to the transfer corona device 240 is a detack corona device 242 which facilitates removal of the paper sheet 236 from the photoreceptor belt 212.

After being advanced through the transfer station 237, the paper sheet advances to a fusing fuser assembly 246 to permanently affix the transferred powder image to the paper sheet. The fuser assembly includes a heated fuser roller 248 and a backup or pressure roller 250. When the paper passes between the fuser roller and the backup roller, the toner powder is permanently affixed to the sheet. After fusing, chute 252 guides the finished sheet to output tray 254. After the finished sheet 236 has separated from the photoreceptor belt 212, the image area of the photoreceptor belt is advanced to a cleaning station where residual toner particles on the image area are removed via cleaning brush 256 making the image area of the photoreceptor belt ready to begin a new image marking cycle.

Various functions of the document reproduction device 200 are managed by master controller 260 which controls many aspects of the image reproduction operations described above. In the embodiment shown, the master controller receives information regarding any of the various sub-assemblies, including the tension rollers, drive rollers. Various design aspects and features of master controllers used for controlling internal components of complex document reproduction devices vary widely in the arts and generally include a central processor executing machine program instructions, a buffer, memory, storage, and a communications interface for providing notifications to a technician either directly or through a control panel (not shown). The master controller is also in communication with the onboard microprocessor of dc motor controller 244 which controls the operation of dc motor 220. Operationally, the master controller 260 instructs the dc motor controller 244 to regulate the movement of dc motor 220 by varying the duty cycle of the motor. The microprocessor of the dc motor controller communicates to the master controller about many aspects of dc motor. It should be understood that there are many dc motor controllers in a single device (or on a single circuit board) regulating a variety of brushed and/or brushless dc motors in a single complex document reproduction system. The embodiment of FIG. 2 illustrates a single master controller 260 in communication with one dc motor controller 244 regulating a brushless dc motor 220. Other variations of the embodiment of FIG. 2 are well known in the arts.

In one embodiment shown, dc motor controller 244 uses pulse width modulation to regulate dc motor 220. As a modulated pulse is sent to the dc motor, internal coils of the dc motor create a strong magnetic field which causes the motor to rotate. The dc motor controller then sends another pulse of electricity and the next phase fires, rotating the motor even further. Unlike SCR (thyristor drive) controls which switch at line frequency, dc motor controllers, utilizing pulse width modulation, produce smoother current at higher switching frequencies, typically between 1 and 20 kHz. At 20 kHz, the switching frequency is inaudible to human hearing thereby eliminating the hum which switching at lower frequency produces. DC motor controllers typically contains a large reservoir capacitor and an H-Bridge or Triple Half Bridge (for a brushless dc motor) arrangement of power transistors consisting of a minimum of four mechanical or solid-state switches, such as two NPN and two PNP transistors. One NPN and one PNP transistor are activated at a time. Amplifiers can use N Channel and P Channel Power FETS or all N Channel FETS with a charge pump. Both NPN or PNP transistors can be activated to cause a short across the motor terminals, which can be useful for slowing down the motor from the back EMF it creates. Typically, a digital microprocessor circuit of the dc motor controller uses a counter connected to a circuit clock which increments periodically and is reset at the end of every period of the PWM. When the counter value is more than the reference value, the PWM output changes state from high to low (or low to high). The incremented and periodically reset counter is the discrete version of the previously discussed intersecting method's sawtooth. An analog comparator of the intersecting method becomes a simple integer comparison between the current counter value and the digital reference value. In such a manner, dc motor controller 244 varies the duty cycle of dc motor 220 in discrete steps as a function of the counter resolution.

Figure 3:
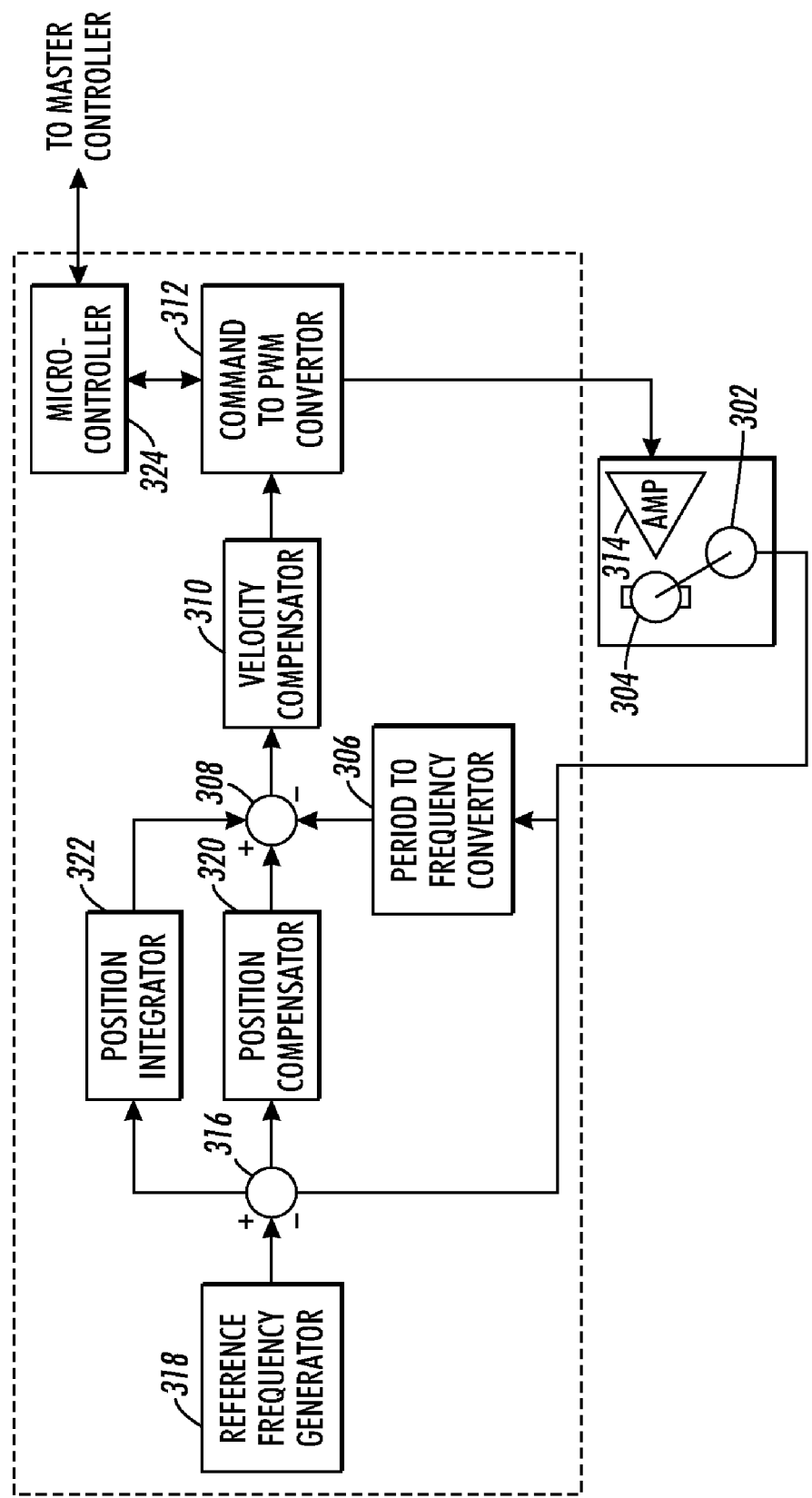
FIG. 3 illustrates a block diagram of one embodiment of a controller for controlling a dc motor and capturing pulse width modulation data.

Reference is now being made to FIG. 3 which illustrates a block diagram of one embodiment of a dc motor controller for regulating the duty cycle of a dc motor. In general, a dc motor controller is a servo-mechanism utilizing a high speed capture function available on industry standard micro controllers for period measurement (250 nanoseconds to 2 microsecond resolution). The period is converted to a frequency using a 1/T calculation or a 1/T table with linear interpretation. A velocity loop uses proportional control with a single pole (512 microseconds to 2 milliseconds sample time). The structure of the control is state driven with independent state machines for each motor and serial communication. A digital phase lock loop (PLL) acts as a velocity integrator (zero steady state velocity error) around the proportional velocity loop. The PLL uses an up/down counter with fractional resolution between an internally generated reference frequency and the motor encoder to produce an error value. The error value has gain compensation to drive the input to the velocity loop. The phase lock loop can be enabled or disabled during constant velocity. A position integrator can also be enabled and gain compensated to provide zero steady state position error. The initial conditions for changing between velocity and position mode are also programmable to minimize ringing during the transition. The state routines or procedures also provide programmable parameters and input sensor reads to allow for position applications, for example, a document registration system.

More specifically, encoder 302 is connected to dc motor 304 and provides motor speed signals to period-to-frequency converter 306 which provides an input to summing junction 308. The summing junction provides a signal to velocity compensator 310 which provides a motor command to command to PWM converter 312. Converter 312 provides a pulse width modulated signal to amplifier 314 to regulate the duty cycle of dc motor 304. This is the velocity loop. The phase lock loop includes an up/down counter 316 which receives signals from reference frequency generator 318 as well as from encoder 302. The up/down counter 316 provides a position error signal to position compensator 320 which in turn provides one of the signal inputs to summing junction 308. Position integrator 322 can be enabled and compensated to provide a zero state position error. The onboard digital microprocessor controller 324 receives a command from the master controller to move the dc motor at a predetermined speed in a predetermined direction. The microprocessor controller 324 instructs the command to PWM converter to provide the dc motor with the appropriate signals. The command to PWM converter 312 provides micro-controller 324 with the captured PWM data. The captured PWM data is provided to the master controller.

Various parameter or variables are programmable or adjustable automatically from microprocessor 324 of the dc motor controller in response to input from the master controller. For example, the motor's velocity, acceleration time, deceleration time, frequency, and initial conditions can be profile parameters. In addition, the microprocessor controller 324 is capable of downloading commands that will yield or provide the required velocity and position profiles for the required application. Thus, the dc motor controller can be customized to a motion application by sending parameters to the microcontroller through a command bus. The programmable ability of the closed loop algorithms generally allows one mask ROM or firm-ware to run a multitude of different motor control applications.

Figure 4:
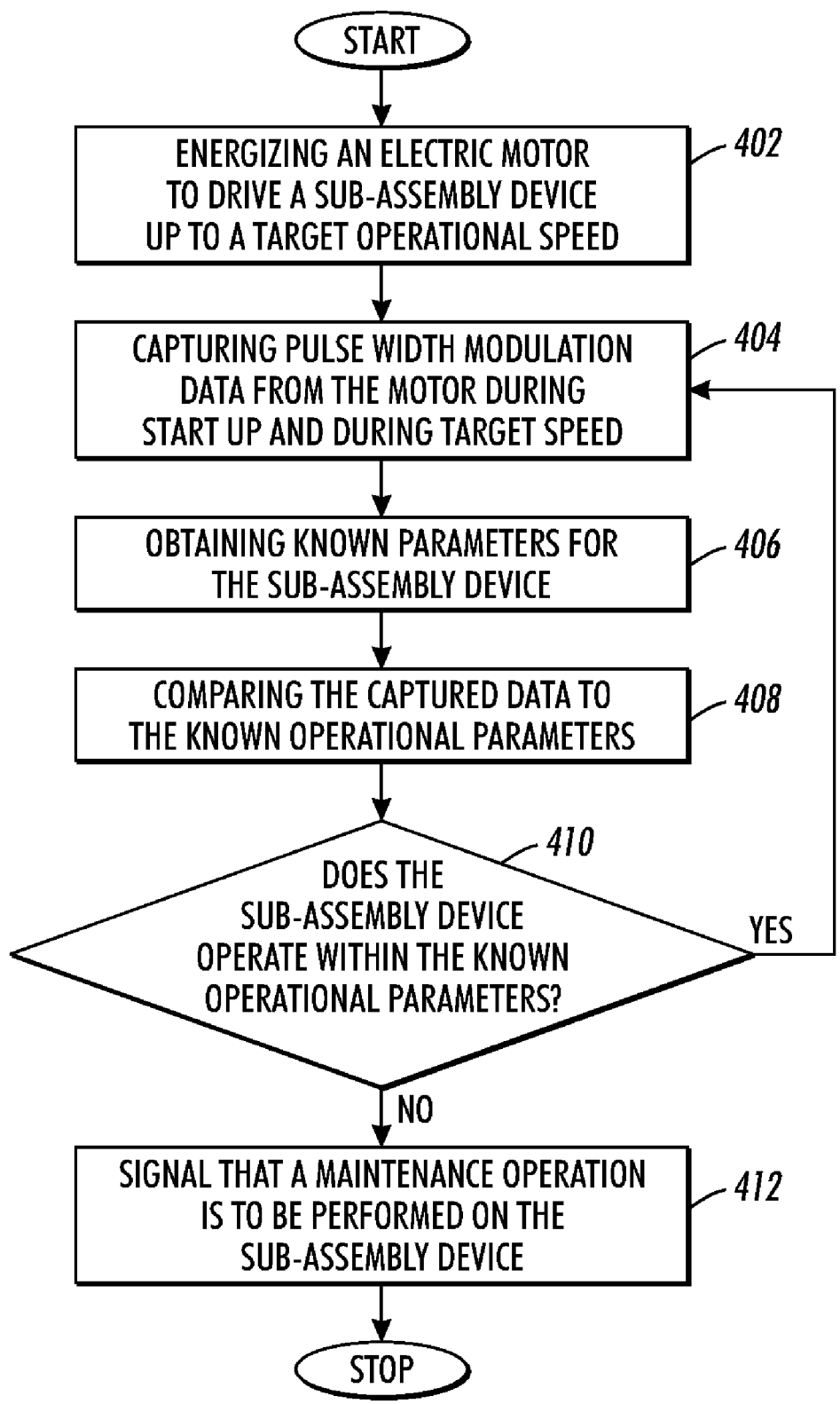
FIG. 4 illustrates a flow diagram of one embodiment of the present method for determining performance of a sub-assembly device driven by a dc motor.

Reference is now being made to FIG. 4 which illustrates a flow diagram of one embodiment of the present method for determining performance of a sub-assembly device driven by a dc motor. The resolution of the torque of the sub-assembly driven by the dc motor can be examined through the captured PWM data and a determination made whether the sub-assembly is operating within predetermined optimal operating performance ranges.

In one example embodiment, at step 402, an electric motor is energized with electrical power such that a sub-assembly device driven by the motor achieves a target operating speed. At step 404, pulse width modulation data is captured from the motor. At step 406, known operational parameters for the sub-assembly device are obtained. These can be stored locally and retrieved by the master controller or uploaded to the master controller by a technician. At step 408, the captured PWM data is compared to the known parameters defined for that sub-assembly device. At 410, a determination is made, based on the result of that comparison, whether the sub-assembly device is performing within accepted operational parameters. If the sub-assembly device is performing within accepted parameters then the master controller can continue to receive more captured data from the dc motor controller or the performance test of the sub-assembly device can conclude. If it is determined that the sub-assembly device is not operating within optimal operational parameters then, at step 412, a maintenance operation is signaled or scheduled to be performed in response to the determined sub-assembly operational performance. Results out of range on the high end might indicate that there is excessive belt tension, bearing drag or other physical phenomena increasing the torque during operation. Results out of range on the low side might indicate the following: the assembly was improperly loaded into the fixture or machine, the rollers may be excessively worn causing poor NIP, the drive belt was too loose or stretched, or the gearing mechanism did not properly engage.

Figure 5:
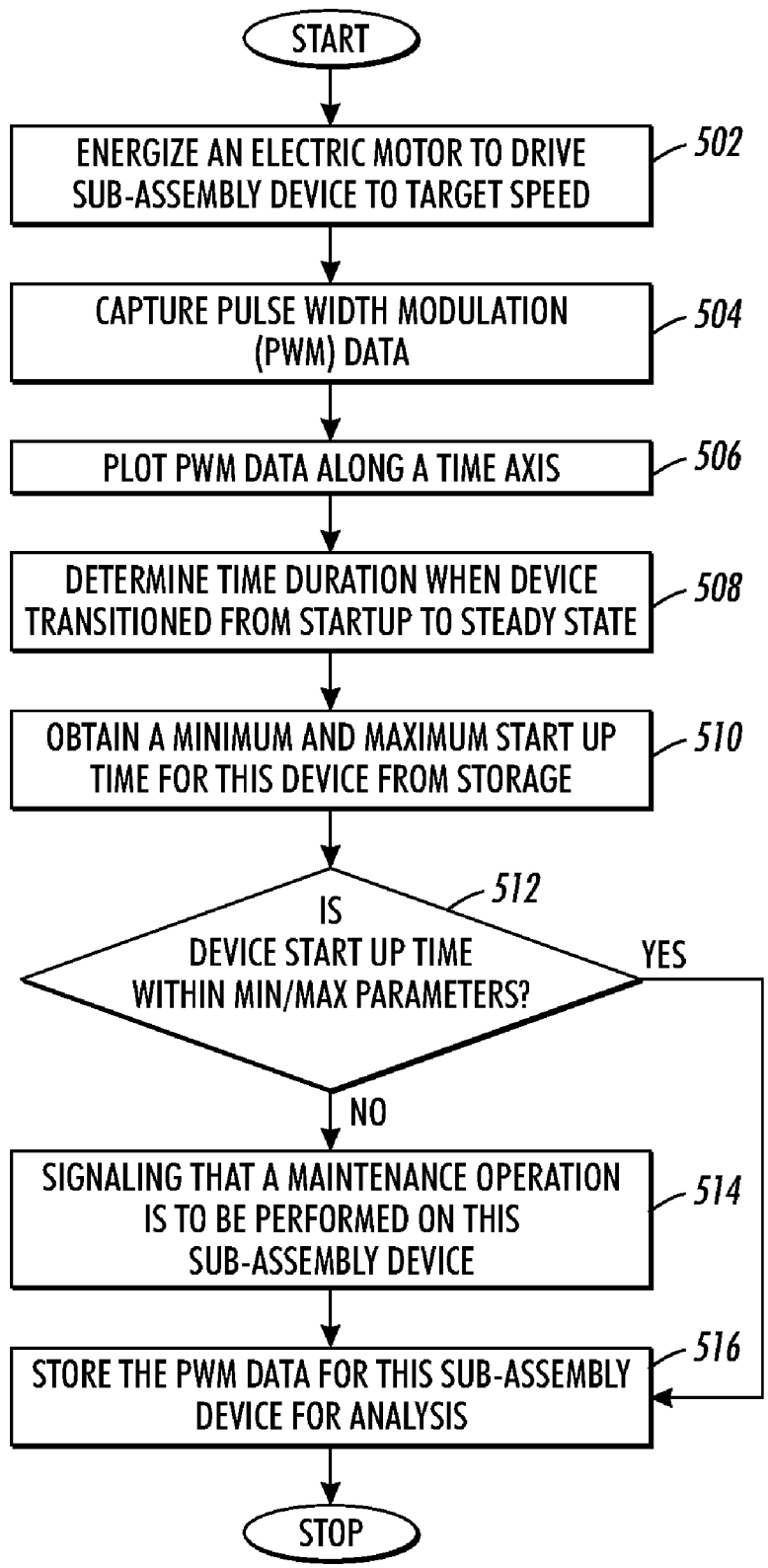
FIG. 5 illustrates a flow diagram of one embodiment of the present method for determining a startup performance of a sub-assembly device driven by a dc motor.

Reference is now being made to FIG. 5 which illustrates a flow diagram of one embodiment for determining a startup performance of a sub-assembly device driven by a dc motor in accordance with the present method.

In one example embodiment, at step 502, a pulse width modulation controller energizes an electric direct current (dc) motor with electrical power such that the sub-assembly driven by the dc motor achieves a desired operating speed. At step 504, startup and steady state pulse width modulation data is captured from the energized motor. The pulse with modulation data can be normalized to compensate for differences in gearing ratios between the energized motor and the sub-assembly device. At step 506, the data is plotted along a time axis. At step 508, a startup time performance value is determined from the startup data. The startup value is a time duration representing when the device transitioned from a startup operation to a steady state operation. At step 510, a known startup performance value is retrieved from storage. The known startup performance value can be a minimum and maximum startup time window defined for a particular sub-assembly device. The determined startup performance value is compared, at step 512, to the known startup performance value. The comparison result facilitates the determination whether a physical phenomenon exists during a startup operation of the sub-assembly device which requires maintenance. If the determined startup performance value does not meet the known startup performance value, at step 514, a maintenance operation is signaled to be performed in response to the determined sub-assembly operational performance. At step 516, the pulse width modulation data and the comparison results are stored in a database. A preventative maintenance schedule for the sub-assembly can be derived from stored historical data.

Figure 6A:
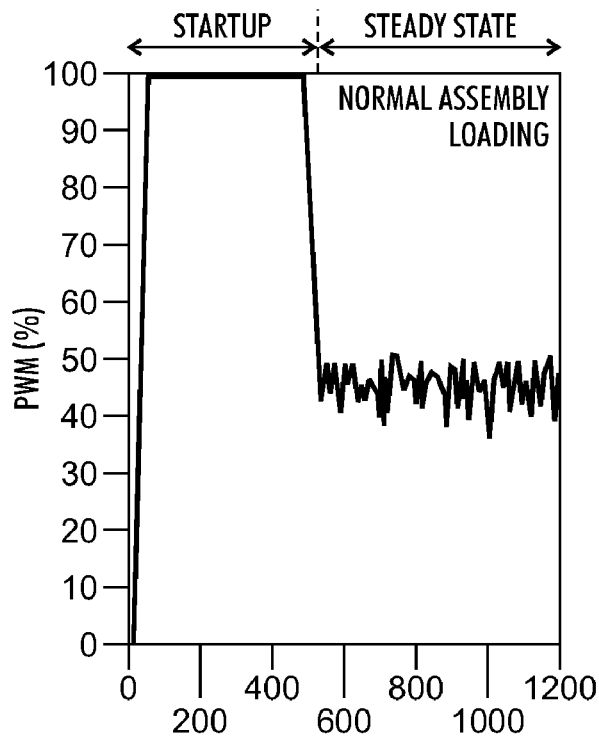
FIGS. 6A and 6B are pulse width modulation plots for a sub-assembly in the normal operation (ideal curve) and for the condition requiring maintenance.
Figure 6B:
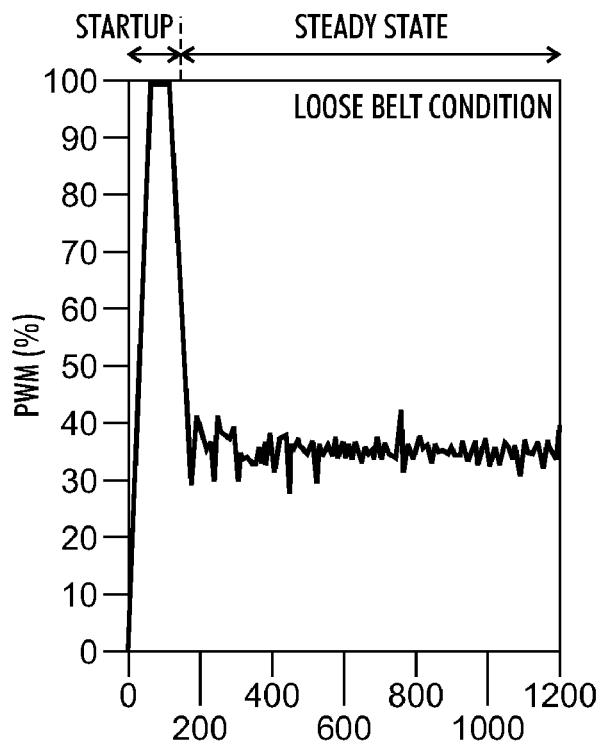

Reference is now being made to the flow diagram of FIGS. 6A and 6B illustrating curves of plotted pulse width modulation data for a de-curler sub-assembly driven by a brushless dc motor via a belt and pulley.

FIG. 6A represents normal operation and loading for this particular sub-assembly. This plot represents the ideal curve for this particular type of sub-assembly device. Note that the normal startup time completes after approximately 200 milliseconds. FIG. 6B represents the same assembly with belt slippage. The startup time for this sub-assembly completes after approximately 100 milliseconds. A comparison of the startup time for this assembly against the ideal curve would show that there was a significant torque reduction in the startup operational cycle. Because this fell below a predetermined operational startup parameter for this device, a physical phenomenon can be determined to exist for this sub-assembly device requiring maintenance. It should be understood that the startup area of the pulse width modulation data represents the ability of the dc motor controller to bring the sub-assembly device into a specified operational range (achieve a target operating speed). The longer it takes for the device to exit the startup phase, the higher the initial torque response of the sub-assembly (the more torque it takes to drive the assembly). By assessing an amount of startup drag of the sub-assembly device, a range of optimum operability can be determined. Under normal control conditions, there would be a maximum amount of time allowed to achieve target operating speed of the sub-assembly before a operational failure is indicated. This maximum dc motor controller condition is designed to catch a stall condition. The area between a normal operation and a stall condition can be effectively utilized to determine startup drag and thus predict failure. A maintenance operation can be signaled to be performed by a technician in advance of a failure of the device.

Figure 7:
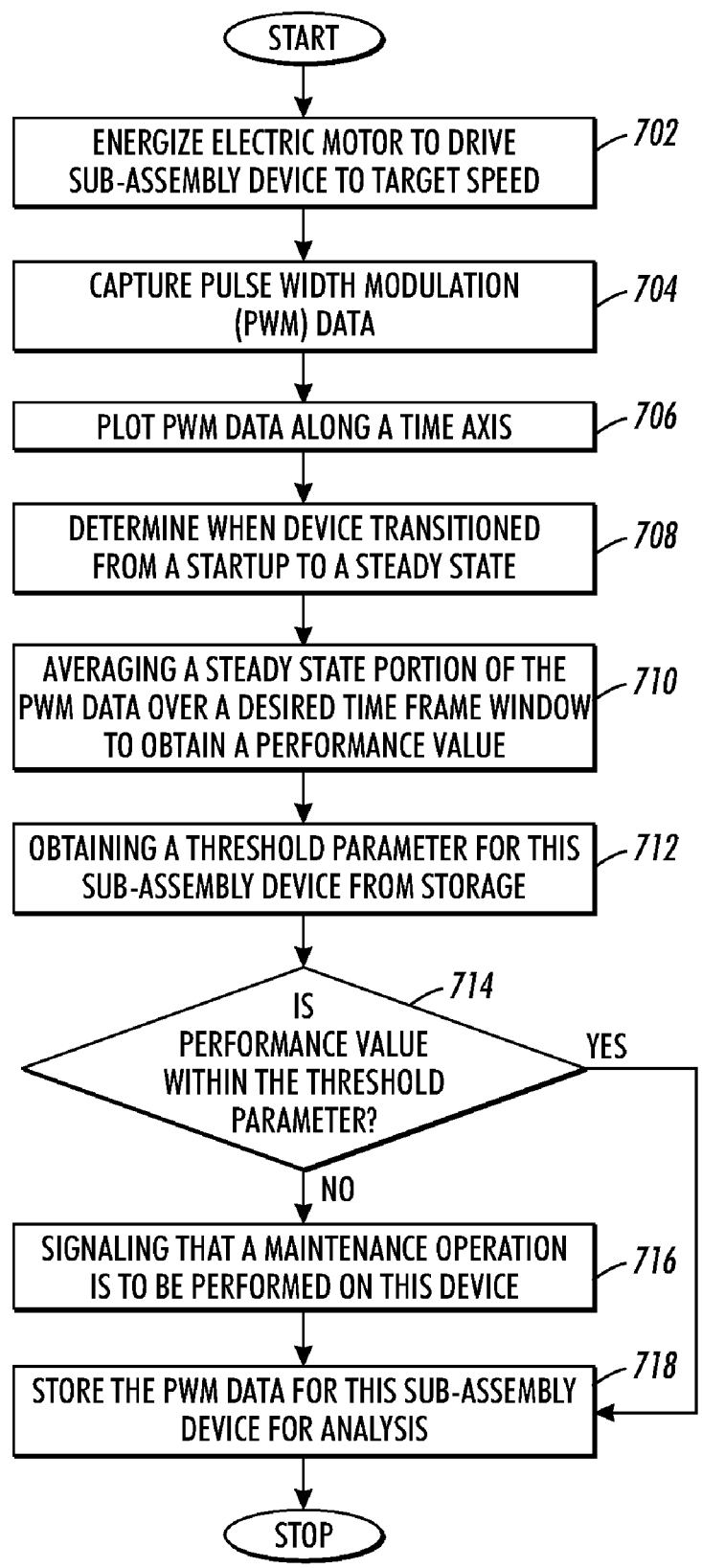
FIG. 7 illustrates a flow diagram of one embodiment of the present method for determining a steady state performance of a sub-assembly device driven by a dc motor.

Reference is now being made to FIG. 7 which illustrates a flow diagram of one embodiment for determining a steady state performance of a sub-assembly device driven by a dc motor in accordance with the present method.

In one example embodiment, at step 702, a pulse width modulation controller energizes an electric direct current (dc) motor with electrical power such that the sub-assembly driven by the dc motor achieves a desired operating speed. At step 704, startup and steady state pulse width modulation data is captured from the energized motor. The pulse with modulation data can be normalized to compensate for differences in gearing ratios between the energized motor and the sub-assembly device. At step 706, the pulse width modulation data is plotted on a time axis. At step 708, a transition between a startup state and a steady state is determined. At step 710, at least a portion of the steady state data is averaged over a desired timeframe window to obtain at least one steady state performance value. Alternatively, the data is weighted to minimize certain characteristics while enhancing others. Many alternatives are envisioned. At step 712, at least one known threshold value is retrieved from storage. Alternatively, a range of values, a min/max window, any other known steady state performance value(s) are retrieved from storage. At step 714, the determined steady state performance value is compared to the retrieved known threshold value. If it is determined that the determined steady state performance value did not meet the expected threshold, in either direction, then at step 716, a maintenance operation is signaled to be performed on the sub-assembly. At step 718, the data and the results of the comparison are stored for further use and analysis.

Captured data can be stored in a historical database. Once sufficient historical data has been stored, various statistical analytical and fuzzy logic techniques can be applied depending on the sophistication of the environment in which the sub-assemblies will likely find their intended uses. Statistical samples can be compared to known operational data for similar such assemblies to determine when maintenance will likely be required. A preventative maintenance schedule for these and other similarly constructed sub-assembly devices can be derived. Preventative maintenance routines may contact or otherwise notify a service technician to order parts in advance of a maintenance cycle before a device operational failure actually occurs.

It should be further understood that the signaling of the maintenance operation as discussed herein and claimed can be anything from a LED light being activated on a control panel; to an email or text message being sent to the appropriate technician; to ordering parts; to a fax/phone/text/voice message being forwarded to a customer, technician, or service representative to schedule a maintenance or repair operation. In addition, it is contemplated herein that the system itself may automatically swap-out the failing assembly, or modify device parameters, or adjust other functionality within the system containing the failing device in an effort to compensate for the assembly not meeting performance parameters.

The present method will also find its intended uses in the manufacturing process wherein test jigs along a production line are used to analyze various performance characteristics of a sub-assembly device under test in the manner disclosed herein. Any implementation in any test system or manufacturing process wherein pulse width modulation data is obtained from a dc-motor driving a device and used to assess a performance characteristic of an assembly device under test are also intended to fall within the scope of the appended claims.

Figure 8:
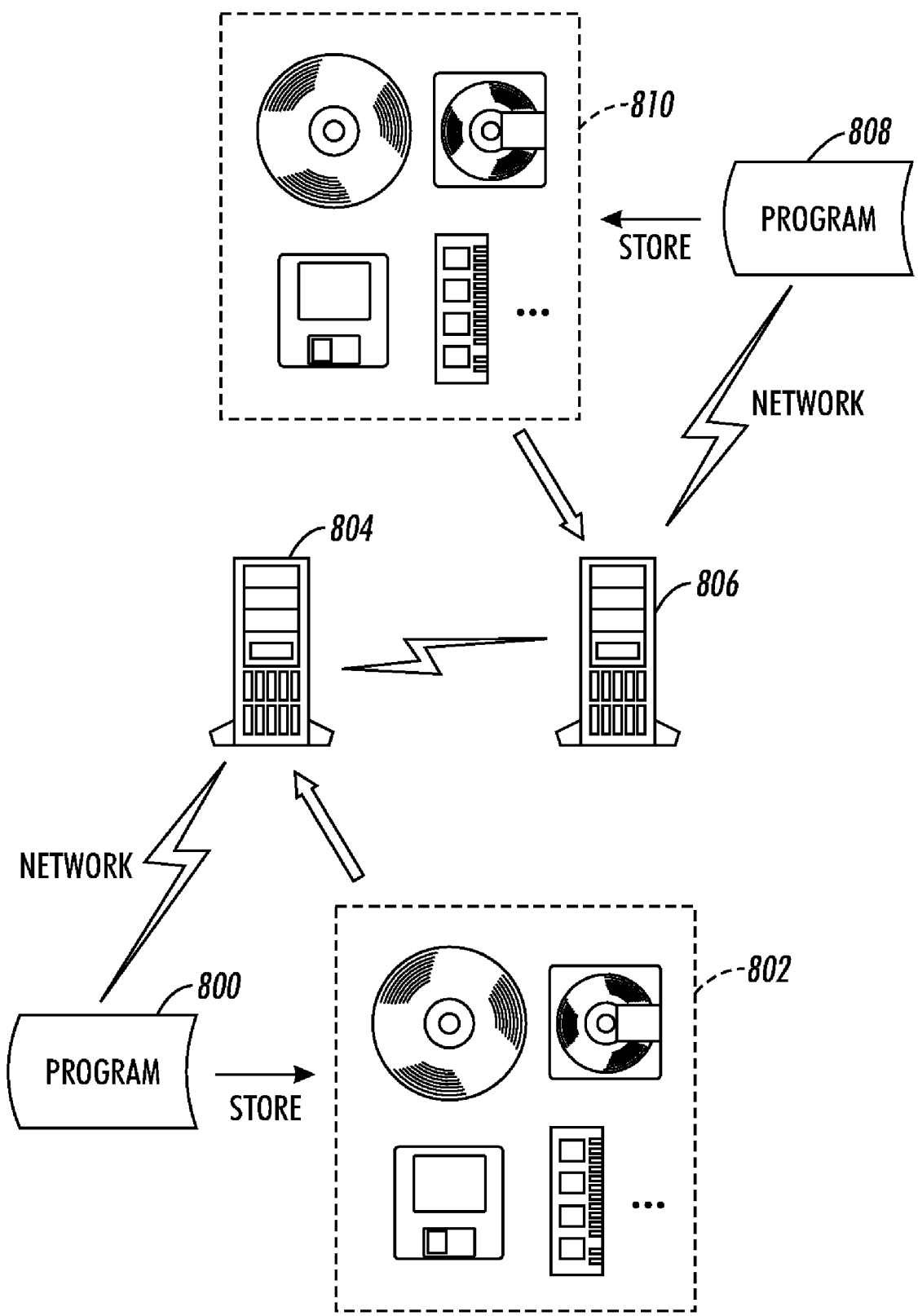
FIG. 8 is an explanatory diagram illustrating one example of a computer storage medium storing machine readable program code containing instructions which cause the computer to execute one or more steps of the present method.

Reference is now being made to FIG. 8 which is an explanatory diagram illustrating one example of a computer storage medium storing machine readable program code containing instructions which, when mounted on computer system, cause the computer to perform one or more steps of the present method.

One or more computer program instructions 800 for carrying out the present method are loaded on computer-readable storage media 802 which includes media such as optical disks (CD-ROM etc.), magnetic disks, magnetic cards, memories (including IC cards and memory card). The storage media stores the machine readable program instructions for sale, transport, and storage by changing magnetic, optical, and/or electric energy states in response to program description instructions having been transferred to the media. The storage medium can then be mounted on computer system 804 and transferred or otherwise communicated to computer system 806. The program instructions can then be off-loaded to another program 806, in original form or modified, including data, and stored on storage media 810. Both of the computer systems include processors in communication with the printing system of FIG. 2 and/or the controller of FIG. 3 capable of executing program instructions represented by the flow diagram of FIGS. 4, 5 and 7.

Each of the processor is in communication with a bus (e.g., a backplane interface bus, cross-over bar, or data network). The processes read the machine instructions from the storage media and execute the instructions to perform one or more steps of the present method. These systems also include a main memory capable of storing machine readable instructions including system programming functionality ancillary to or necessary for the execution of one or more steps of the present method. The main memory is also capable of storing data used by or produced by the processor. The main memory may alternatively include random access memory (RAM) to support reprogramming and flexible data storage. The main memory typically includes a buffer to temporarily store data for access by the processor and a program memory that may include executable programs required to implement the steps of the methods described herein. The program memory is further capable of storing a subset of the data contained in the buffer.

The computer system may also include a secondary memory. The secondary memory may include, for example, a hard disk drive and/or a removable storage drive which reads and writes to removable storage unit, such as a floppy disk, magnetic tape, optical disk, etc., that stores computer software and/or data. The secondary memory may further include other similar mechanisms for allowing computer programs or other machine readable instructions to be loaded into the computer system. Such mechanisms may include, for example, a removable storage unit adapted to exchange data through an interface. Examples of such mechanisms include a program cartridge and cartridge interface (such as that found in video game devices), a removable memory chip (such as an EPROM, or PROM) and associated socket, and other removable storage units and interface devices which allow software and data to be transferred from the removable storage unit to the computer system. One or both of the computer systems typically will include an interface that forwards data from a communication bus or from a frame buffer to a display device.

The computer system may further include a communications interface which acts as both an input and an output to allow software and data to be transferred between the computer system and one or more external devices. Examples of a communications interface include a modem, a network interface (such as an Ethernet card), a communications port, a PCMCIA slot and card, etc. Software and data transferred via the communications interface are in the form of signals which may be, for example, electronic, electromagnetic, optical, or other signals capable of being transmitted/received by a communication interface. These signals are provided via a communications path (i.e., a channel) which carries such signals and may be implemented using wire, cable, fiber optic, phone line, cellular link, RF, or other communications channels.

Terms such as, computer program medium, computer executable medium, computer usable medium, and computer readable medium, are used herein to generally refer to media such as main memory and secondary memory, removable storage drives, a disk installed in a hard drive, and other signals. These computer program products are means for providing instructions and/or data to the computer system. The computer readable medium stores data, instructions, messages packets, or other machine readable information. The computer readable medium, for example, may include non-volatile memory, such as a floppy, ROM, flash memory, disk memory, CD-ROM, and other permanent storage useful, for example, for transporting information, such as data and computer instructions.

Furthermore, the computer readable medium may comprise computer readable information in a transitory state medium such as a network link and/or a network interface, including a wired network or a wireless network, which allows a computer to read such computer readable information. Computer programs (also called computer control logic) may be stored in main memory and/or secondary memory. Computer programs may also be received via a communications interface. Such computer programs, when executed, enable the computer system to perform the features and capabilities provided herein.

It should be understood that the flow diagrams depicted herein are illustrative. Other operations, for example, may be added, modified, enhanced, condensed, integrated, or consolidated. Variations thereof are envisioned and are intended to fall within the scope of the appended claims.

It should also be understood that the method described in the flowcharts provided herewith can be implemented on a special purpose computer, a micro-processor or micro-controller, an ASIC or other integrated circuit, a DSP, an electronic circuit such as a discrete element circuit, a programmable device such as a PLD, PLA, FPGA, PAL, PDA, and the like. In general, any device capable of implementing a finite state machine that is in turn capable of implementing one or more elements of the flow diagrams provided herewith, or portions thereof, can be used. Portions of the flow diagrams may also be implemented partially or fully in hardware in conjunction with machine executable instructions.

Furthermore, the flow diagrams hereof may be partially or fully implemented in software using object or object-oriented software development environments that provide portable source code that can be used on a variety of computer, workstation, server, network, or other hardware platforms. One or more of the capabilities hereof can be emulated in a virtual environment as provided by an operating system, specialized programs, or from a server.

It should also be understood that the teachings hereof can be implemented in hardware or software using any known or later developed systems, structures, devices, and/or software by those skilled in the applicable art without undue experimentation from the functional description provided herein with a general knowledge of the relevant arts. Moreover, the methods hereof may be readily implemented as software executed on a programmed general purpose computer, a special purpose computer, a microprocessor, or the like. In this case, the methods hereof can be implemented as a routine embedded on a personal computer or as a resource residing on a server or workstation, such as a routine embedded in a plug-in, a printer, a photocopier, a driver, a scanner, a photographic system, a xerographic device, or the like. The methods provided herein can also be implemented by physical incorporation into an image processing, image reproduction, or color management system.

One or more aspects of the methods described herein are intended to be incorporated in an article of manufacture, including one or more computer program products, having computer usable or machine readable media. For purposes hereof, a computer usable or machine readable media is, for example, a floppy disk, a hard-drive, memory, CD-ROM, DVD, tape, cassette, or other digital or analog media, or the like, which is capable of having embodied thereon a computer readable program, one or more logical instructions, or other machine executable codes or commands that implement and facilitate the function, capability, and methodologies described herein.

Furthermore, the article of manufacture may be included on at least one storage device readable by the machine architecture or other xerographic or image processing system embodying executable program instructions capable of performing the methodology described herein. Additionally, the article of manufacture may be included as part of a xerographic system, an operating system, a plug-in, or may be shipped, sold, leased, or otherwise provided separately either alone or as part of an add-on, update, upgrade, or product suite.

It will be appreciated that the above-disclosed and other features and functions, or alternatives thereof, may be desirably combined into many other different systems or applications. Various presently unforeseen or unanticipated alternatives, modifications, variations, or improvements therein may become apparent and/or subsequently made by those skilled in the art which are also intended to be encompassed by the following claims. Accordingly, the embodiments set forth above are considered to be illustrative and not limiting. Various changes to the above-described embodiments may be made without departing from the spirit and scope of the invention.

What is claimed is:

1. A method for determining performance of a sub-assembly device driven by a direct current (DC) motor, the method comprising;
   using a DC motor controller for:
      energizing a direct current (DC) electric motor with electrical power such that a sub-assembly device driven by a rotational movement of said motor achieves a desired target operating speed;

capturing pulse width modulation data from said motor, said data representative of a torque response of said sub-assembly device;

plotting said captured pulse width modulation data on a time axis and determining a transition wherein said sub-assembly device transitioned from a startup operation comprising startup data to a steady state operation comprising steady state data;

comparing said plotted startup data to an ideal curve defined for said sub-assembly device to determine whether a torque reduction of said sub-assembly device in said startup operation has fallen below a predetermined operational startup parameter;

averaging at least a portion of said steady state data over a desired timeframe window to obtain a performance value of said steady state operation; and comparing said steady state performance value to a threshold defined for said sub-assembly at said target operating speed;

based on a result of either of said comparisons, determining whether said sub-assembly device is performing within an accepted operational parameter; and performing a maintenance operation in response to a signal that said sub-assembly device is not operating within said accepted operational parameter.

2. The method of claim 1, wherein, in advance of comparing said plotted startup data to said ideal curve, further comprising retrieving a startup performance value comprising a minimum and a maximum startup time window defined for said sub-assembly device.

3. The method of claim 1, further comprising retrieving any of: a range of values, a min/max window, and steady state performance values from a non-transitory storage medium.

4. The method of claim 1, further comprising:
storing said captured pulse width modulation data; and
determining a preventative maintenance schedule based on the stored data from other similar sub-assembly devices.

5. The method of claim 1, further comprising:
banding said captured pulse width modulation data with banding threshold values; and
determining whether said sub-assembly device is performing within said accepted operational parameter based on whether said captured data is within said banding threshold values.

6. The method of claim 1, further comprising normalizing said pulse with modulation data to compensate for differences in gearing ratios between said energized motor and said sub-assembly device.

7. A system for determining performance of a sub-assembly device driven by a direct current (dc) motor, the system comprising:
a direct current (dc) motor connected to an electrical energy source;
at least one sub-assembly device driven by a rotational movement of said direct current dc motor;
a controller for controlling said dc motor, said controller capable of capturing pulse width modulation data comprising startup and steady state data representative of a torque response of said sub-assembly device;
a non-transitory storage medium; and
a processor in communication with said non-transitory storage medium and said controller, said processor executing machine readable instructions comprising:
energizing said direct current (dc) motor with electrical power such that said sub-assembly device achieves a desired target operating speed;

receiving pulse width modulation data from said controller, said data representative of a torque response of said sub-assembly device;

plotting said captured pulse width modulation data on a time axis and determining a transition wherein said sub-assembly device transitioned from a startup operation comprising startup data to a steady state operation comprising steady state data;

comparing said plotted startup data to an ideal curve defined for said sub-assembly device to determine whether a torque reduction of said sub-assembly device in said startup operation has fallen below a predetermined operational startup parameter;

averaging at least a portion of said steady state data over a desired timeframe window to obtain a performance value of said steady state operation;

comparing said at least one steady state performance value to a threshold defined for said sub-assembly at said target operating speed;

based on a result of either of said comparisons, determining whether said sub-assembly device is performing within an accepted operational parameter; and performing a maintenance operation in response to a signal that said sub-assembly device is not operating within said accepted operational parameter.

8. The system of claim 7, wherein, in advance of comparing said plotted startup data to said ideal curve, further comprising retrieving a startup performance value comprising a minimum and a maximum startup time window defined for said sub-assembly device.

9. The method of claim 7, further comprising retrieving any of: a range of values, a min/max window, and steady state performance values from a non-transitory storage medium.

10. The system of claim 7, further comprising:
storing said captured pulse width modulation data; and
determining a preventative maintenance schedule based on the stored data from other similar sub-assembly devices.

11. The system of claim 7, further comprising:
banding said captured pulse width modulation data with banding threshold values; and
determining whether said sub-assembly device is performing within said accepted operational parameter based on whether said captured data is within said banding threshold values.

12. The system of claim 7, further comprising normalizing said pulse width modulation data to compensate for differences in gearing ratios between said energized motor and said sub-assembly device.

13. A computer program product for determining performance of a sub-assembly device driven by a direct current (dc) motor, the computer program product comprising:
a non-transitory computer-usable storage medium storing instructions that, when executed on a computer, cause the computer to perform a method comprising:
energizing a direct current (dc) electric motor with electrical power such that a sub-assembly device driven by a rotational movement of said motor achieves a desired target operating speed;
capturing pulse width modulation data from said motor, said data representative of a torque response of said sub-assembly device;
plotting said captured pulse width modulation data on a time axis and determining a transition wherein said sub-assembly device transitioned from a startup operation comprising startup data to a steady state operation comprising steady state data;

comparing said plotted startup data to an ideal curve defined for said sub-assembly device to determine whether a torque reduction of said sub-assembly device in said startup operation has fallen below a predetermined operational startup parameter;

averaging at least a portion of said steady state data over a desired timeframe window to obtain a performance value of said steady state operation;

comparing said at least one steady state performance value to a threshold defined for said sub-assembly at said target operating speed;

based on a result of either of said comparisons, determining whether said sub-assembly device is performing within an accepted operational parameter; and performing signaling that a maintenance operation in response to a signal that said sub-assembly device is not operating within said accepted operational parameter.

14. The computer program product of claim 13, wherein, in advance of comparing said plotted startup data to said ideal curve, further comprising retrieving a startup performance value comprising a minimum and a maximum startup time window defined for said sub-assembly device.

15. The computer program product of claim 13, further comprising retrieving any of: a range of values, a min/max window, and steady state performance values from said non-transitory storage medium.

16. The computer program product of claim 13, further comprising:
storing said captured pulse width modulation data; and
determining a preventative maintenance schedule based on the stored data from other similar sub-assembly devices.

17. The computer program product of claim 13, further comprising:
banding said captured pulse width modulation data with banding threshold values; and
determining whether said sub-assembly device is performing within said accepted operational parameter based on whether said captured data is within said banding threshold values.

18. The computer program product of claim 13, further comprising normalizing said pulse with modulation data to compensate for differences in gearing ratios between said energized motor and said sub-assembly device.

* * * * *